United States Patent
Pelley et al.

(10) Patent No.: US 10,559,356 B2
(45) Date of Patent: Feb. 11, 2020

(54) MEMORY CIRCUIT HAVING CONCURRENT WRITES AND METHOD THEREFOR

(71) Applicant: NXP USA, INC., Austin, TX (US)

(72) Inventors: Perry H. Pelley, Austin, TX (US); Anirban Roy, Austin, TX (US); Gayathri Bhagavatheeswaran, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/622,738

(22) Filed: Jun. 14, 2017

(65) Prior Publication Data

US 2018/0366191 A1  Dec. 20, 2018

(51) Int. Cl.

| G11C 11/00 | (2006.01) |
|---|---|
| G11C 13/00 | (2006.01) |
| G11C 7/10 | (2006.01) |
| G11C 11/22 | (2006.01) |
| G11C 16/10 | (2006.01) |
| G11C 11/16 | (2006.01) |
| G11C 8/14 | (2006.01) |
| G11C 11/406 | (2006.01) |

(52) U.S. Cl.
CPC ............ *G11C 13/0069* (2013.01); *G11C 7/10* (2013.01); *G11C 7/1096* (2013.01); *G11C 8/14* (2013.01); *G11C 11/1675* (2013.01); *G11C 11/2275* (2013.01); *G11C 11/40603* (2013.01); *G11C 13/004* (2013.01); *G11C 13/0026* (2013.01); *G11C 16/10* (2013.01); *G11C 2013/0088* (2013.01); *G11C 2207/2209* (2013.01)

(58) Field of Classification Search
CPC .................................................. G11C 13/0097
USPC .......................................................... 365/148
See application file for complete search history.

(56) References Cited

U.S. PATENT DOCUMENTS

| 6,445,231 | B1 | 9/2002 | Baker et al. |
| 6,477,104 | B1 | 11/2002 | Atwell et al. |
| 6,552,947 | B2 | 4/2003 | Longwell et al. |
| 7,016,418 | B2 | 3/2006 | Wang et al. |
| 7,286,385 | B2 * | 10/2007 | Barth, Jr. ................. G11C 7/02 365/205 |
| 9,281,042 | B1 | 3/2016 | Pelley et al. |
| 9,437,298 | B1 * | 9/2016 | Tomishima .......... G11C 14/009 |
| 2009/0268509 | A1 * | 10/2009 | Maejima ................ G11C 5/02 365/148 |
| 2012/0182795 | A1 | 7/2012 | Estakhri et al. |
| 2012/0257437 | A1 | 10/2012 | Seko et al. |
| 2014/0036602 | A1 * | 2/2014 | Sharma .................... G11C 7/08 365/189.05 |

(Continued)

*Primary Examiner* — Min Huang (57) ABSTRACT

A memory circuit includes a plurality of memory tiles. Each memory tile in the plurality of memory tiles includes a plurality of bit cells and a control circuit coupled to the plurality of bit cells. The control circuit is configured to provide latched data to the plurality of bit cells during write operations. A first write control line is coupled to the control circuit in a first memory tile, and the first write control line is configured to initiate a first write operation in the first memory tile. And a second write control line is coupled to the control circuit in a second memory tile, and the second write control line configured to initiate a second write operation in the second memory tile. The second write operation may be initiated before the first write operation is completed.

20 Claims, 7 Drawing Sheets

(56) References Cited

U.S. PATENT DOCUMENTS

| | | | |
|---|---|---|---|
| 2015/0071020 A1 | 3/2015 | Javanifard | |
| 2015/0310904 A1* | 10/2015 | Kim | G11C 11/1693 365/158 |
| 2015/0310913 A1* | 10/2015 | Kim | G11C 11/1659 711/103 |
| 2015/0310914 A1* | 10/2015 | Kim | G11C 13/0069 711/125 |
| 2015/0380085 A1* | 12/2015 | Park | G11C 13/0069 365/148 |
| 2016/0099052 A1* | 4/2016 | Lee | G11C 13/0069 365/148 |
| 2016/0172034 A1* | 6/2016 | Oh | H03M 13/27 714/763 |
| 2017/0068584 A1* | 3/2017 | Park | G11C 11/406 |
| 2017/0090802 A1* | 3/2017 | Margetts | G06F 3/0679 |
| 2017/0092354 A1 | 3/2017 | Pelley et al. | |
| 2017/0278556 A1* | 9/2017 | Antonyan | G11C 11/1655 |
| 2017/0336989 A1 | 11/2017 | Zawodny et al. | |

\* cited by examiner

MEMORY CIRCUIT HAVING CONCURRENT WRITES AND METHOD THEREFOR

BACKGROUND

Field

This disclosure relates generally to memory circuits, and more specifically, to memory circuits having concurrent writes.

Related Art

Memories employing magnetoresistive elements such as magnetic tunnel junction (MTJ) structures are gaining popularity as an alternative to flash memories and other non-volatile memories. To be commercially practical, these memories must have comparable memory density to current memory technologies, be scalable for future generations, operate at low voltages, have low power consumption, and have competitive read/write speeds.

Writing data to a memory cell may be accomplished by passing current into a magnetoresistive element and causing the magnetoresistive element to be in either a low resistance state or high resistance state. Reading data stored in the memory may be accomplished by sensing differences in resistance between the two states in the magnetoresistive elements. Unfortunately, writing data to a memory cell may be substantially slower than reading data stored in the memory cell.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an integrated circuit memory that includes resistive non-volatile memory (NVM) bit cells arranged in memory tiles. Each memory tile includes read and write control circuitry allowing concurrent write operations in different memory tiles. Because write operations can occur in a first memory tile, and a second write operation can occur in a second memory tile before the first write is completed, overall write times can be compressed when concurrently writing to several memory tiles. Thus, overall read/write performance can rival as an alternative to static random access memory (SRAM) or dynamic random access memory (DRAM).

Figure 1:
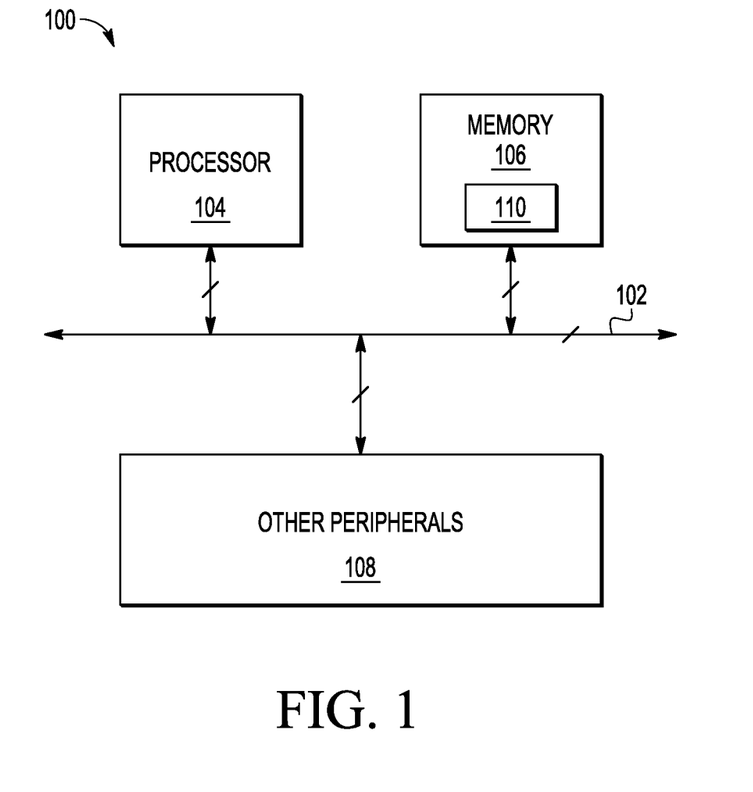
FIG. 1 illustrates, in simplified block diagram form, an exemplary integrated circuit in accordance with an embodiment of the present invention.

FIG. 1 illustrates, in simplified block diagram form, exemplary integrated circuit 100 in accordance with an embodiment of the present invention. In some embodiments, integrated circuit 100 may be characterized as a system-on-a-chip (SoC). Integrated circuit 100 includes a system bus 102, processor 104, memory 106, and other peripherals 108. Processor 104, memory 106, and other peripherals 108 are each bi-directionally coupled to system bus 102 by way of respective communication buses. In some embodiments, memory 106 may be formed on a die separate from a die including integrated circuit 100. In some embodiments, memory 106 may be formed as a stand-alone memory.

System bus 102 can be any type of bus for communicating any type of information such as addresses, data, instructions, clocks, and control. System bus 102 provides a communication backbone for communications among the processor 104, memory 106, and other peripherals 108.

Processor 104 may be any type of processor, including circuits for processing, computing, etc., such as a microprocessor (MPU), microcontroller (MCU), digital signal processor (DSP), or other type of processing core. Processing system 100 may include multiple processors like processor 104. Processor 104 is configured to execute instructions in order to carry out one or more designated tasks.

Memory 106 may include any suitable type of non-volatile memory (NVM) array, such as magnetoresistive random-access memory (MRAM), for example. Memory 106 includes memory circuit 110 having non-volatile bit cells and control circuitry arranged in tiles. Memory 106 may also be coupled directly or tightly coupled to processor 104. Integrated circuit 100 may include multiple memories like memory 106 or a combination of different memories. For example, integrated circuit 100 may include a flash memory in addition to memory 106.

Other peripherals 108 of processing system 100 may include any number of other circuits and functional hardware blocks such as accelerators, timers, counters, communications, interfaces, analog-to-digital converters, digital-to-analog converters, PLLs, and the like for example. Other peripherals 108 are each bi-directionally coupled to system bus 102 by way of respective communication buses.

Figure 2:
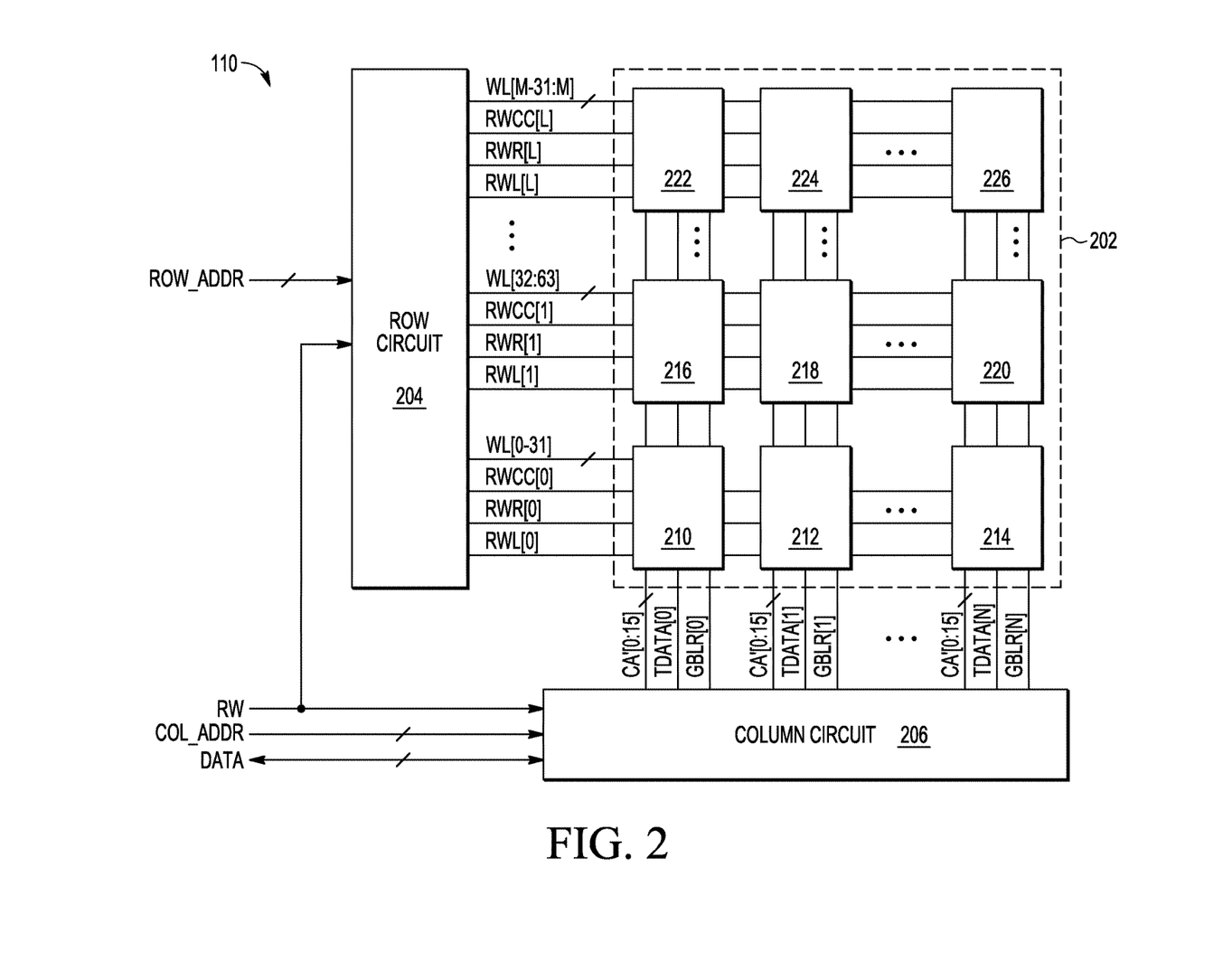
FIG. 2 illustrates, in simplified block diagram form, an exemplary memory circuit in accordance with an embodiment of the present invention.

FIG. 2 illustrates, in simplified block diagram form, exemplary memory circuit 110 in accordance with an embodiment of the present invention. Memory circuit 110 may be a portion of memory 106. For example, memory circuit 110 may be a portion of memory 106 coupled to processor 104 in integrated circuit 100. Memory circuit 110 may be implemented as a magnetoresistive random-access memory (MRAM). Memory circuit 110 may also be implemented as an alternative to static random access memory (SRAM).

Memory circuit 110 includes MRAM tile array 202, row circuit block 204, and column circuit block 206. Row circuit 204 and column circuit 206 are used to read and write data from and to MRAM bit-cells arranged in tiles, such as tiles 210-226 of bit-cell array 202. Row circuit 204 receives row address (ROW_ADDR) and read/write control (RW) signal from a processor, memory management unit (MMU), direct memory access (DMA) unit, or the like for example. Similarly, column circuit 206 receives column address (CO- L_ADDR) and read/write control RW signals from the processor, MMU, DMA, or the like for example. Column circuit 206 provides data signals and receives data signals (DATA) to and from the processor, for example. Row circuit 204 and column circuit 206 may include additional signals.

Tile array 202 includes a plurality of memory tiles 210-226 arranged in L+1 tile rows and N+1 tile columns. Each tile 210-226 includes a plurality of bit cells and control circuitry. In this embodiment, each tile (e.g., 210) is coupled to receive 32 word line signals (e.g., WL[0:31]) and 16 column access signals (e.g., CA'[0:15]) configured to access of 512 bit cells. Control circuitry of each tile (e.g., 210) is coupled to receive control signals (e.g., RWL[0], RWR[0], and RWCC[0]), tile data signals (e.g., TDATA[0]), and provide global bit line data signals (e.g., GBLR[0]).

Row circuit 204 receives row address signals (ROW_ADDR) and a read/write control signal (RW). Row circuit 204 is coupled to provide word line signals (WL[0:M]) and control signals (RWL[0:L], RWR[0:L], and RWCC[0:L]) to tile array 202 by way of word lines labeled WL[0:M] and control lines labeled RWL[0:L], RWR[0:L], and RWCC[0:L], respectively. In this embodiment, groupings of 32 word lines are coupled to each row of L+1 tiles. For example, a first group of word line signals WL[0:31] are provided to a first row of tiles 210-214, a second group of word line signals WL[32:63] are provided to a second row of tiles 216-220, and so on to an $L^{th}$ group of word line signals WL[M−31:M] are provided to an $L^{th}$ row of tiles 222-226. Word line signals may be grouped in any number based on organization and number of bit cells in each tile. Word line signals WL[0:M] along with control signals RWL[0:L], RWR[0:L], and RWCC[0:L] may be used to access bit cells coupled to one or more selected word lines, for example.

Column circuit 206 receives column address signals (COL_ADDR) and the read/write control signal (RW). Column circuit 206 provides and receives data signals (DATA) to and from a processor such as processor 104, for example. Column circuit 206 is coupled to provide column access signals (CA'[0-15]) and tile data signals (TDATA[0:N]) to tile array 202 by way of column access lines labeled CA'[0-15] and tile data lines labeled TDATA[0:N], respectively. Column access signal CA' may be representative of decoded column address signals COL_ADDR, for example. Column circuit 206 is coupled to receive global bit line signals (GBLR[0:N]) from tile array 202 by way of global bit lines labeled GBLR[0:N]. Column circuit 206 may also provide and/or receive other signals. In this embodiment, 16 column access signals are provided to each tile of a tile column. Any number of column access signals may be provided to each tile based on a desired number of bit cells per tile, for example. Column access signals (CA'[0-15]) along with data signals (TDATA[0:N] and GBLR[0:N]) may be used to write and read data to/from bit cells coupled to a selected column, for example.

Figure 3:
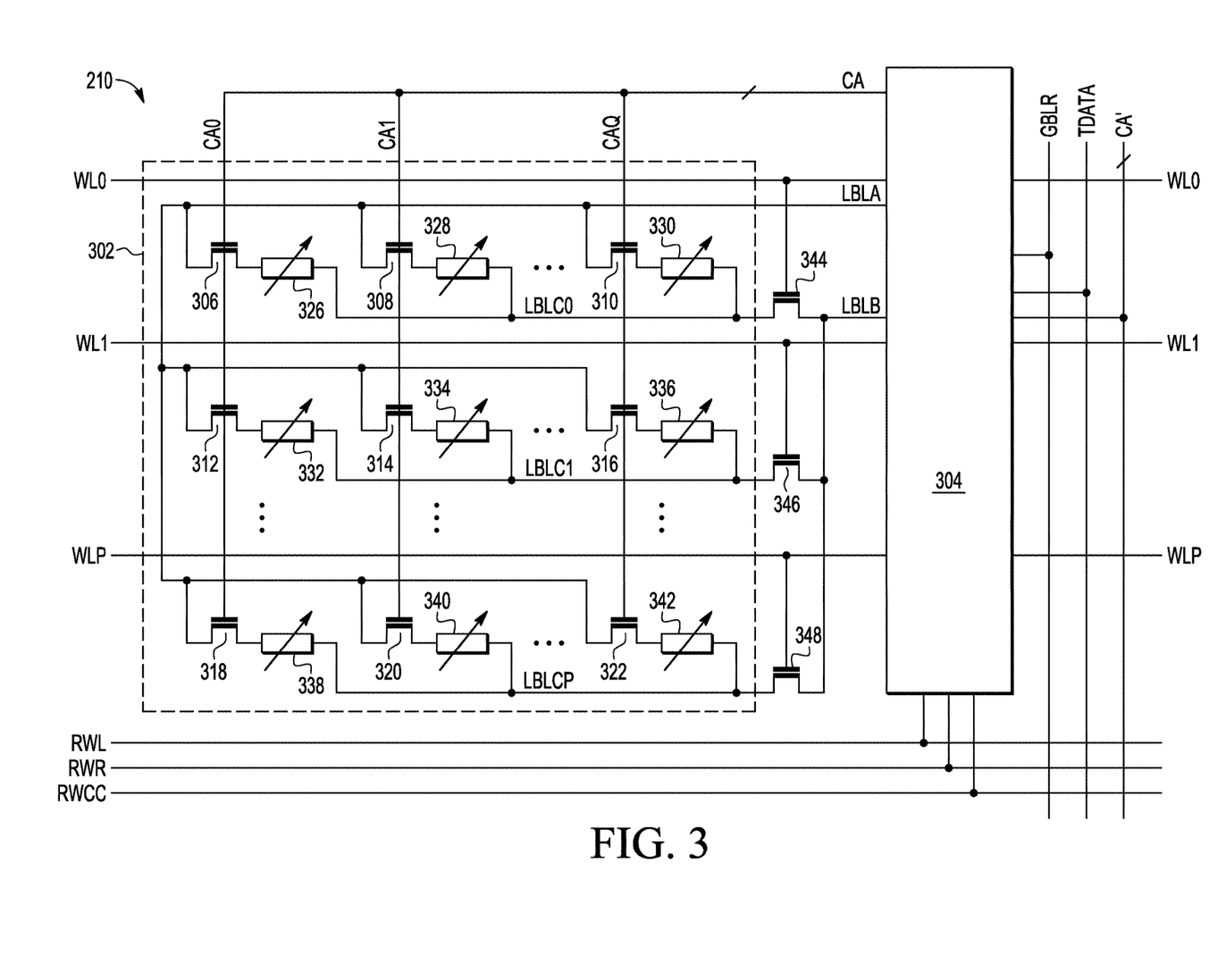
FIG. 3 illustrates, in simplified schematic diagram form, an exemplary memory bit-cell arrangement in accordance with an embodiment of the present invention.

FIG. 3 illustrates, in simplified schematic diagram form, an exemplary memory tile 210 in accordance with an embodiment of the present invention. In this embodiment, tile 210 depicted in FIG. 3 is representative of each tile of tile array 202. Tile 210 includes bit cell arrangement 302, access transistors 344-348, and control circuitry 304. Tile 210 receives word line signals WL0-WLP, column access signals CA'0-CA'Q, control signals RWL, RWR, and RWCC, tile write data signal TDATA, and provides global bit line read data signal GBLR.

For example, referring to embodiments of FIGS. 2 and 3, word lines WL0-WLP are coupled to receive signals WL[0:31] in the first row of tiles (210-214), WL[32:63] in the second row of tiles (216-220), and WL[M−31:M] in the $L^{th}$ row of tiles (222-226). Control signal lines RWL, RWR, and RWCC are coupled to receive control signals RWL[0], RWR[0], and RWCC[0], respectively, in the first row of tiles (210-214), RWL[1], RWR[1], and RWCC[1] in the second row of tiles (216-220), and RWL[L], RWR[L], and RWCC[L] in the $L^{th}$ row of tiles (222-226). Column access signal lines CA' are coupled to receive column access signals CA'[0:15] as shown for each column of tiles (FIG. 2). Tile write data signal line TDATA is coupled to receive tile data signal TDATA[0] in the first column of tiles (210, 216, 222), TDATA[1] in the second column of tiles (212, 218, 224), and TDATA[N] in the $N^{th}$ column of tiles (214, 220, 226). And similarly, global bit line read data signal line GBLR is coupled to provide global bit line read data signals GBLR[0], GBLR[1], through GBLR[N] to column circuit 206 by way of signal lines GBLR[0], GBLR[1], through GBLR[N] coupled to first, second, through $N^{th}$ column of tiles respectively.

Bit cell arrangement 302 includes a plurality of bit cells arranged in P+1 rows and Q+1 columns. P and Q may be any integer numbers where P+1 is the number of bit cell rows corresponding to P+1 word lines labeled WL0-WLP, and where Q+1 is the number of bit cell columns corresponding to Q+1 column access lines labeled CA0-CAQ. In this embodiment, P+1 equals 32 word lines and Q+1 equals 16 column access lines allowing for access to 512 (32×16) bit cells per tile. Each bit cell of the plurality is formed with a select transistor and resistive non-volatile memory (NVM) storage element connected in series (e.g., 306 and 326). In this embodiment, the resistive NVM storage elements may be formed as magnetoresistive storage elements.

For example, N-channel transistor 306 is connected in series with magnetoresistive storage element 326 forming a first bit cell in a first row of bit cell arrangement 302. A first current electrode of transistor 306 is connected to a first local bit line labeled LBLA, a second current electrode of transistor 306 is connected to a first terminal of magnetoresistive storage element 326, and a second terminal of magnetoresistive storage element 326 is connected to a first local bit line segment labeled LBLC0. A control electrode of transistor 306 is connected to a first latched column access line labeled CA0.

N-channel transistor 308 is connected in series with magnetoresistive storage element 328 forming a second bit cell in the first row, parallel to the first bit cell. A first current electrode of transistor 308 is connected to first local bit line LBLA, a second current electrode of transistor 308 is connected to a first terminal of magnetoresistive storage element 328, and a second terminal of magnetoresistive storage element 328 is connected to the first local bit line segment LBLC0. A control electrode of transistor 308 is connected to a second latched column access line labeled CA1.

N-channel transistor 310 is connected in series with magnetoresistive storage element 330 forming a $Q^{th}$ bit cell in the first row, parallel to the first and second bit cells. A first current electrode of transistor 310 is connected to first local bit line LBLA, a second current electrode of transistor 310 is connected to a first terminal of magnetoresistive storage element 330, and a second terminal of magnetoresistive storage element 330 is connected to the first local bit line segment LBLC0. A control electrode of transistor 310 is connected to a $Q^{th}$ latched column access line labeled CAQ.

Similarly, a second row of bit cells of bit cell arrangement 302 is formed with N-channel transistors 312-316 and magnetoresistive storage elements 332-336 connected in series, respectively. N-channel transistor 312 is connected in series with magnetoresistive storage element 332 forming a first bit cell in the second row of bit cell arrangement 302. A first current electrode of transistor 312 is connected to first local bit line LBLA, a second current electrode of transistor 312 is connected to a first terminal of magnetoresistive storage element 332, and a second terminal of magnetoresistive storage element 332 is connected to a second local bit line segment labeled LBLC1. A control electrode of transistor 312 is connected to the first latched column access line CA0.

N-channel transistor 314 is connected in series with magnetoresistive storage element 334 forming a second bit cell in the second row, parallel to the first bit cell. A first current electrode of transistor 314 is connected to first local bit line LBLA, a second current electrode of transistor 314 is connected to a first terminal of magnetoresistive storage element 334, and a second terminal of magnetoresistive storage element 334 is connected to the second local bit line segment LBLC1. A control electrode of transistor 314 is connected to the second latched column access line CA1.

N-channel transistor 316 is connected in series with magnetoresistive storage element 336 forming a $Q^{th}$ bit cell in the second row, parallel to the first and second bit cells. A first current electrode of transistor 316 is connected to first local bit line LBLA, a second current electrode of transistor 316 is connected to a first terminal of magnetoresistive storage element 336, and a second terminal of magnetoresistive storage element 336 is connected to the second local bit line segment LBLC1. A control electrode of transistor 316 is connected to the $Q^{th}$ latched column access line CAQ.

Likewise, a $P^{th}$ row of bit cells of bit cell arrangement 302 is formed with N-channel transistors 318-322 and magnetoresistive storage elements 338-342 connected in series, respectively. N-channel transistor 318 is connected in series with magnetoresistive storage element 338 forming a first bit cell in the $P^{th}$ row of bit cell arrangement 302. A first current electrode of transistor 318 is connected to first local bit line LBLA, a second current electrode of transistor 318 is connected to a first terminal of magnetoresistive storage element 338, and a second terminal of magnetoresistive storage element 338 is connected to a $P^{th}$ local bit line segment labeled LBLCP. A control electrode of transistor 318 is connected to the first latched column access line CA0.

N-channel transistor 320 is connected in series with magnetoresistive storage element 340 forming a second bit cell in the $P^{th}$ row, parallel to the first bit cell. A first current electrode of transistor 320 is connected to first local bit line LBLA, a second current electrode of transistor 320 is connected to a first terminal of magnetoresistive storage element 340, and a second terminal of magnetoresistive storage element 340 is connected to the $P^{th}$ local bit line segment LBLCP. A control electrode of transistor 320 is connected to the second latched column access line CA1.

N-channel transistor 322 is connected in series with magnetoresistive storage element 342 forming a $Q^{th}$ bit cell in the $P^{th}$ row, parallel to the first and second bit cells. A first current electrode of transistor 322 is connected to first local bit line LBLA, a second current electrode of transistor 322 is connected to a first terminal of magnetoresistive storage element 342, and a second terminal of magnetoresistive storage element 342 is connected to the $P^{th}$ local bit line segment LBLCP. A control electrode of transistor 322 is connected to the $Q^{th}$ latched column access line CAQ.

Access transistors 344-348 are connected between local bit line segments LBLC0-LBLCP and second local bit line labeled LBLB. Each access transistor is connected to receive a word line signal by way of word lines labeled WL0-WLP.

For example, N-channel transistor 344 is connected between first local bit line segment labeled LBLC0 and second local bit line labeled LBLB. A first current electrode of transistor 344 is connected to first local bit line segment LBLC0, a second current electrode of transistor 344 is connected to second local bit line LBLB, and a control electrode of transistor 344 is connected to first word line WL0. Similarly, N-channel transistor 346 is connected between second local bit line segment labeled LBLC1 and second local bit line LBLB. A first current electrode of transistor 346 is connected to second local bit line segment LBLC1, a second current electrode of transistor 346 is connected to second local bit line LBLB, and a control electrode of transistor 346 is connected to second word line WL1. Likewise, N-channel transistor 348 is connected between $P^{th}$ local bit line segment labeled LBLCP and second local bit line LBLB. A first current electrode of transistor 348 is connected to $P^{th}$ local bit line segment LBLCP, a second current electrode of transistor 348 is connected to second local bit line LBLB, and a control electrode of transistor 348 is connected to $P^{th}$ word line WLP.

Control circuitry 304 is coupled to receive column access signals CA'0-CA'Q, tile data TDATA, and read/write control signals RWL, RWR, and RWCC. Control circuitry 304 is also coupled to provide latched column access signals CA0-CAQ to bit cells, local bit line signals LBLA and LBLB, and global bit line read data signal GBLR.

Figure 4:
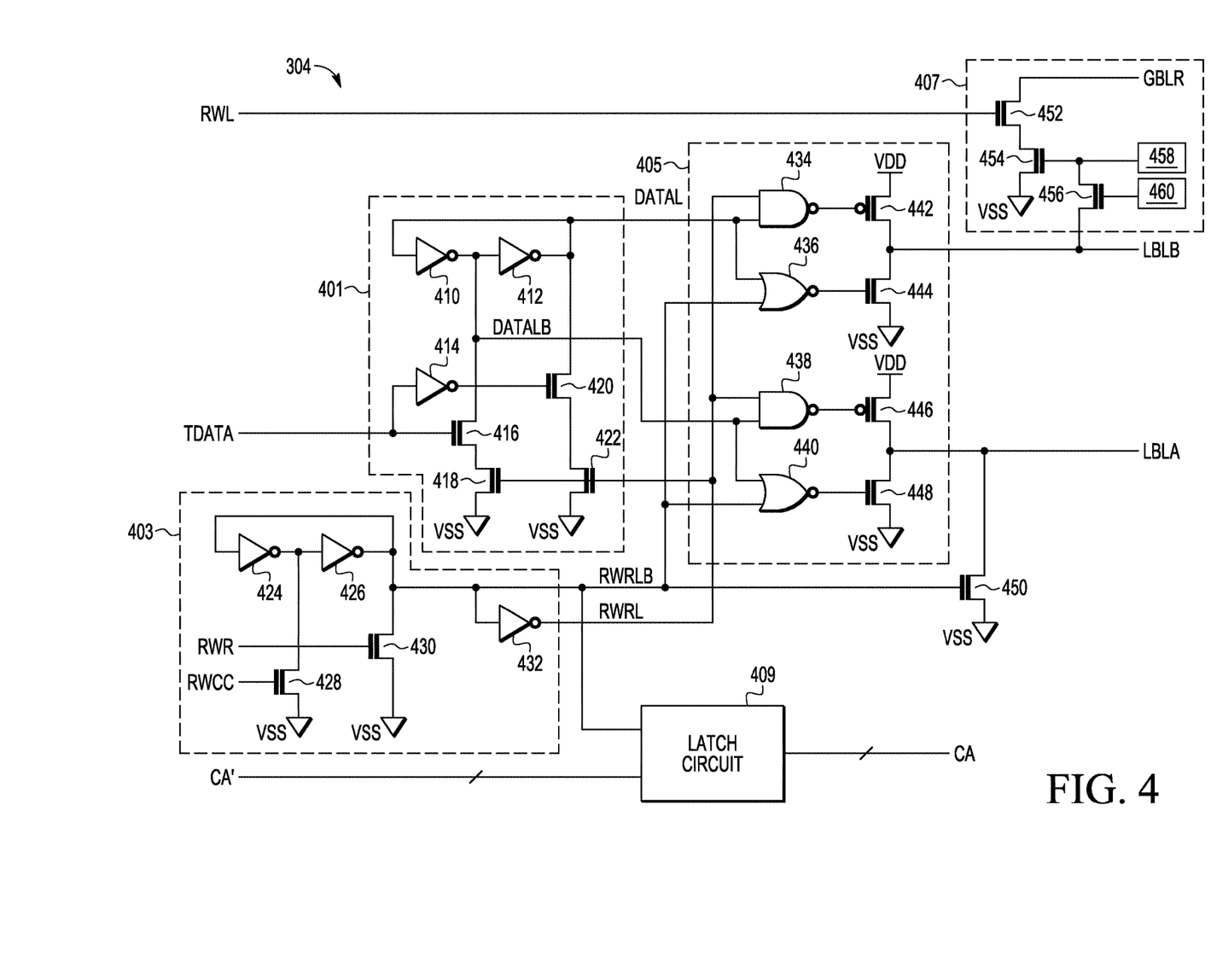
FIG. 4 illustrates, in simplified schematic diagram form, exemplary control circuitry in accordance with an embodiment of the present invention.

FIG. 4 illustrates, in simplified schematic diagram form, exemplary tile control circuitry 304 in accordance with an embodiment of the present invention. Control circuitry 304 includes inputs labeled CA', TDATA, RWL, RWR, and RWCC to receive column access signals CA'0-CA'Q, tile data signal TDATA, and read/write control signals RWL, RWR, and RWCC, respectively. Control circuitry 304 includes outputs labeled CA, LBLA, LBLB, and GBLR to provide latched column access signals CA0-CAQ, local bit line signals LBLA and LBLB, and global bit line read data signal GBLR, respectively. Control circuitry 304 includes data latch circuit 401, tri-state control latch circuit 403, tri-state output circuit 405, read circuit 407, and column access signal latch circuit 409. Control circuitry 304 may include other circuits, inputs, and outputs. In this embodiment, a VDD voltage and a VSS voltage are provided at VDD and VSS power supply terminals respectively. VDD voltage may be characterized as a nominal operating voltage of memory circuit 110 and VSS may be characterized as a ground voltage. The term tri-state output circuit, as used herein, refers to a circuit whose output signal may provide three states: logic high level, logic low level, and high impedance.

Data latch circuit 401 receives a tile data signal TDATA at a first input, a latched row write signal labeled RWRL at a second input, and provides a latched data signal DATAL at a first output labeled DATAL and a complement latched data signal DATALB at a second output labeled DATALB. Data latch circuit 401 includes cross-coupled latch inverters 410 and 412, pull-down N-channel transistors 416-422, and inverter 414.

An input of inverter 410 is connected to an output of inverter 412 at node DATAL, and an output of inverter 410 is connected to an input of inverter 412 at node DATALB. A first current electrode of transistor 416 is connected to the output of inverter 410 at node DATALB, a second current electrode of transistor 416 is connected to a first current electrode of transistor 418, and a control electrode of transistor 416 is connected to first input TDATA. A second current electrode of transistor 418 is connected to a first power supply terminal labeled VSS, and a control electrode of transistor 418 is connected to the second input at node RWRL. A first current electrode of transistor 420 is connected to the output of inverter 412 at node DATAL, a second current electrode of transistor 420 is connected to a first current electrode of transistor 422, and a control electrode of transistor 420 is connected to an output of inverter 414. An input of inverter 414 is connected to first input TDATA. A second current electrode of transistor 422 is connected to the first power supply terminal VSS, and a control electrode of transistor 422 is connected to second input at node RWRL.

Tri-state control latch circuit 403 receives a row write control signal RWR at a first input, a row write cycle complete signal labeled RWCC at a second input, and provides a latched tri-state control signal RWRL at a first output labeled RWRL and a complement latched tri-state control signal RWRLB at a second output labeled RWRLB. Tri-state control latch circuit 403 includes cross-coupled latch inverters 424 and 426, pull-down N-channel transistors 428-430, and inverter 432.

An input of inverter 424 is connected to an output of inverter 426 at node RWRLB, and an output of inverter 424 is connected to an input of inverter 426. A first current electrode of transistor 428 is connected to the output of inverter 424, a second current electrode of transistor 428 is connected to first power supply terminal VSS, and a control electrode of transistor 428 is connected to second input RWCC. A first current electrode of transistor 430 is connected to the output of inverter 426 at node RWRLB, a second current electrode of transistor 430 is connected to the first power supply terminal VSS, and a control electrode of transistor 430 is connected to first input RWR. An input of inverter 432 is connected to the output of inverter 426 at node RWRLB, and an output of inverter 432 is connected to provide latched tri-state control signal RWRL at node RWRL.

Tri-state output circuit 405 receives latched data signal DATAL and complement latched data signal DATALB, and latched tri-state control signal RWRL and complement latched tri-state control signal RWRLB. Tri-state output circuit 405 provides local bit line output signals LBLA and LBLB. Tri-state output circuit 405 includes NAND gate 434 and NOR gate 436 connected to P-channel transistor 442 and N-channel transistor 444 respectively, and NAND gate 438 and NOR gate 440 connected to P-channel transistor 446 and N-channel transistor 448 respectively, to form output signals LBLB and LBLA.

A first input of NAND gate 434 is connected to output of inverter 432 at node RWRL, and a second input of NAND gate 434 is connected to output of inverter 412 at node DATAL. A first input of NOR gate 436 is connected to output of inverter 412 at node DATAL, and a second input of NOR gate 436 is connected to output of inverter 426 at node RWRLB. A first current electrode of transistor 442 is connected to a second power supply terminal labeled VDD, a second current electrode of transistor 442 is connected to local bit line LBLB, and a control electrode of transistor 442 is connected to output of NAND gate 434. A first current electrode of transistor 444 is connected to second current electrode of transistor 442 and local bit line LBLB, a second current electrode of transistor 444 is connected to first power supply terminal labeled VSS, and a control electrode of transistor 444 is connected to output of NOR gate 436.

A first input of NAND gate 438 is connected to output of inverter 432 at node RWRL, and a second input of NAND gate 438 is connected to output of inverter 410 at node DATALB. A first input of NOR gate 440 is connected to output of inverter 410 at node DATALB, and a second input of NOR gate 440 is connected to output of inverter 426 at node RWRLB. A first current electrode of transistor 446 is connected to second power supply terminal VDD, a second current electrode of transistor 446 is connected to local bit line LBLA, and a control electrode of transistor 446 is connected to output of NAND gate 438. A first current electrode of transistor 448 is connected to second current electrode of transistor 446 and local bit line LBLA, a second current electrode of transistor 448 is connected to first power supply terminal VSS, and a control electrode of transistor 448 is connected to output of NOR gate 440.

Read circuit 407 receives read word line signal RWL at read word line input labeled RWL and provides global bit line read data signal GBLR at global bit line read data line labeled GBLR. Read circuit 407 includes N-channel transistors 452-456, current reference generator 458, and voltage reference generator 460.

A first current electrode of transistor 452 is connected to global bit line read data line GBLR, a second current electrode of transistor 452 is connected to a first current electrode of transistor 454, and a control electrode of transistor 452 is connected to receive the read word line signal RWL. A second current electrode of transistor 454 is connected to first power supply terminal VSS, and a control electrode of transistor 454 is connected to a first current electrode of transistor 456 and an output of current reference generator 458. A second current electrode of transistor 456 is connected to local bit line LBLB, and a control electrode of transistor 456 is connected to an output of voltage reference generator 460. Current reference generator 458 may include any appropriate circuitry to provide a reference current suitable for proper operation of read circuit 407. Likewise, voltage reference generator 460 may include any appropriate circuitry to provide a reference voltage suitable for proper operation of read circuit 407.

Pull-down N-channel transistor 450 is connected to receive complement latched tri-state control signal RWRLB at node RWRLB to hold local bit line LBLA at a logic low level during a read operation. A first current electrode of transistor 450 is connected to local bit line LBLA, a second current electrode is connected to first power supply terminal VSS, and a control electrode of transistor 450 is connected to the output of inverter 426.

Column access signal latch circuit 409 is connected to receive complement latched tri-state control signal RWRLB and column access signals CA' by way of control line labeled RWRLB and column access lines labeled CA' respectively. Column access signal latch circuit provides latched column access signals CA by way of latched column access lines labeled CA to bit cell select transistors 306-322 (FIG. 3).

Figure 5:
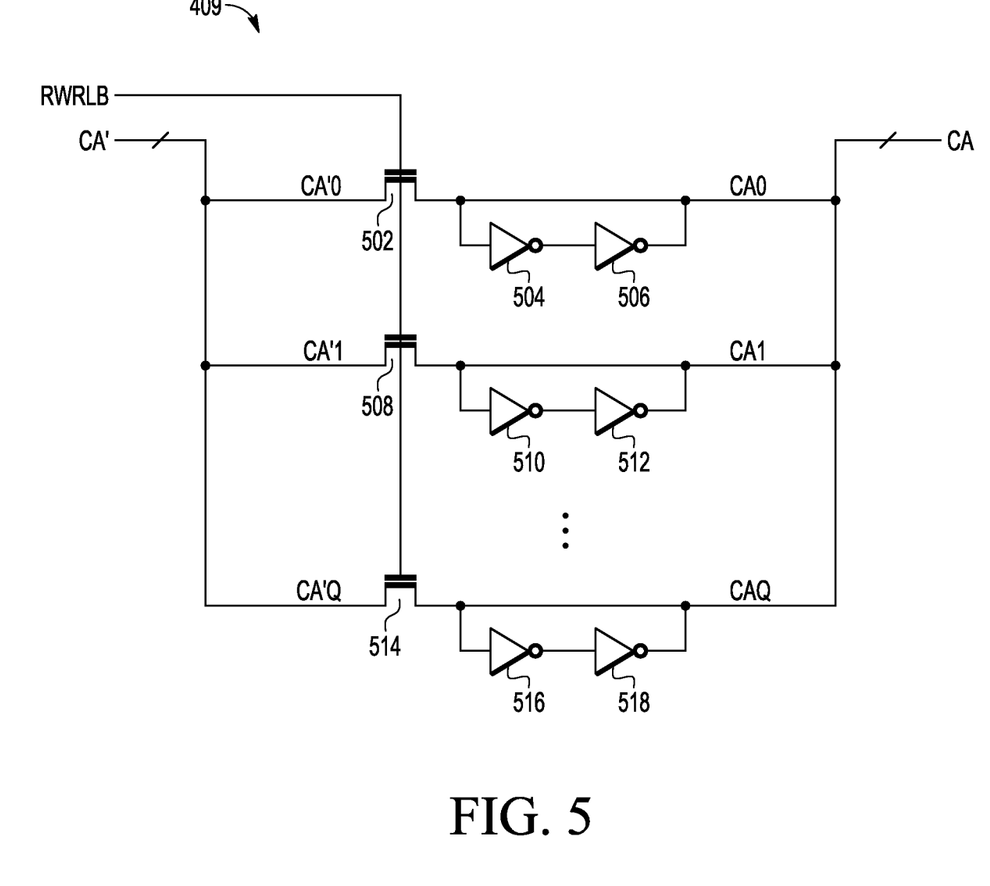
FIG. 5 illustrates, in simplified schematic diagram form, exemplary column access signal latch circuitry in accordance with an embodiment of the present invention.

FIG. 5 illustrates, in simplified schematic diagram form, exemplary column access signal latch circuitry 409 in accordance with an embodiment of the present invention. Column access signal latch circuitry 409 includes a plurality of column access signal latches, each column access signal latch in the plurality being associated with a unique column access signal (CA'0-CA'Q). Column access signals CA'0-CA'Q are received by way of column access lines labeled CA'0-CA'Q. Locally latched column access signals CA0-CAQ are provided by way of latched column access lines labeled CA0-CAQ. Each access signal is latched based on complement row write signal RWRLB by way of complement row write line labeled RWRLB. Column access signal latch circuitry 409 may include any suitable latch circuits to latch column access signals and provide latched column access signals.

In this embodiment, each column access latch includes a pass transistor (502, 508, 514) connected to a cross-coupled inverter-pair latch circuit (504-506, 510-512, 516-518). For example, a first current electrode of pass transistor 502 is connected to column access line CA'0, a second current electrode connected to latched column access line CA0 and to an input of inverter 504 of first cross-coupled inverter-pair. An output of inverter 504 is connected to an input of inverter 506 of the first cross-coupled inverter-pair, and an output of inverter 506 is connected to latched column access line CA0 and to an input of inverter 504.

Similarly, a first current electrode of pass transistor 508 is connected to column access line CA'1, a second current electrode connected to latched column access line CA1 and to an input of inverter 510 of second cross-coupled inverter-pair. An output of inverter 510 is connected to an input of inverter 512 of the second cross-coupled inverter-pair, and an output of inverter 512 is connected to latched column access line CA1 and to an input of inverter 510.

Likewise, a first current electrode of pass transistor 514 is connected to column access line CA'Q, a second current electrode is connected to latched column access line CAQ and to an input of inverter 516 of $Q^{th}$ cross-coupled inverter-pair. An output of inverter 516 is connected to an input of inverter 518 of the $Q^{th}$ cross-coupled inverter-pair, and an output of inverter 518 is connected to latched column access line CAQ and to an input of inverter 516.

Figure 6:
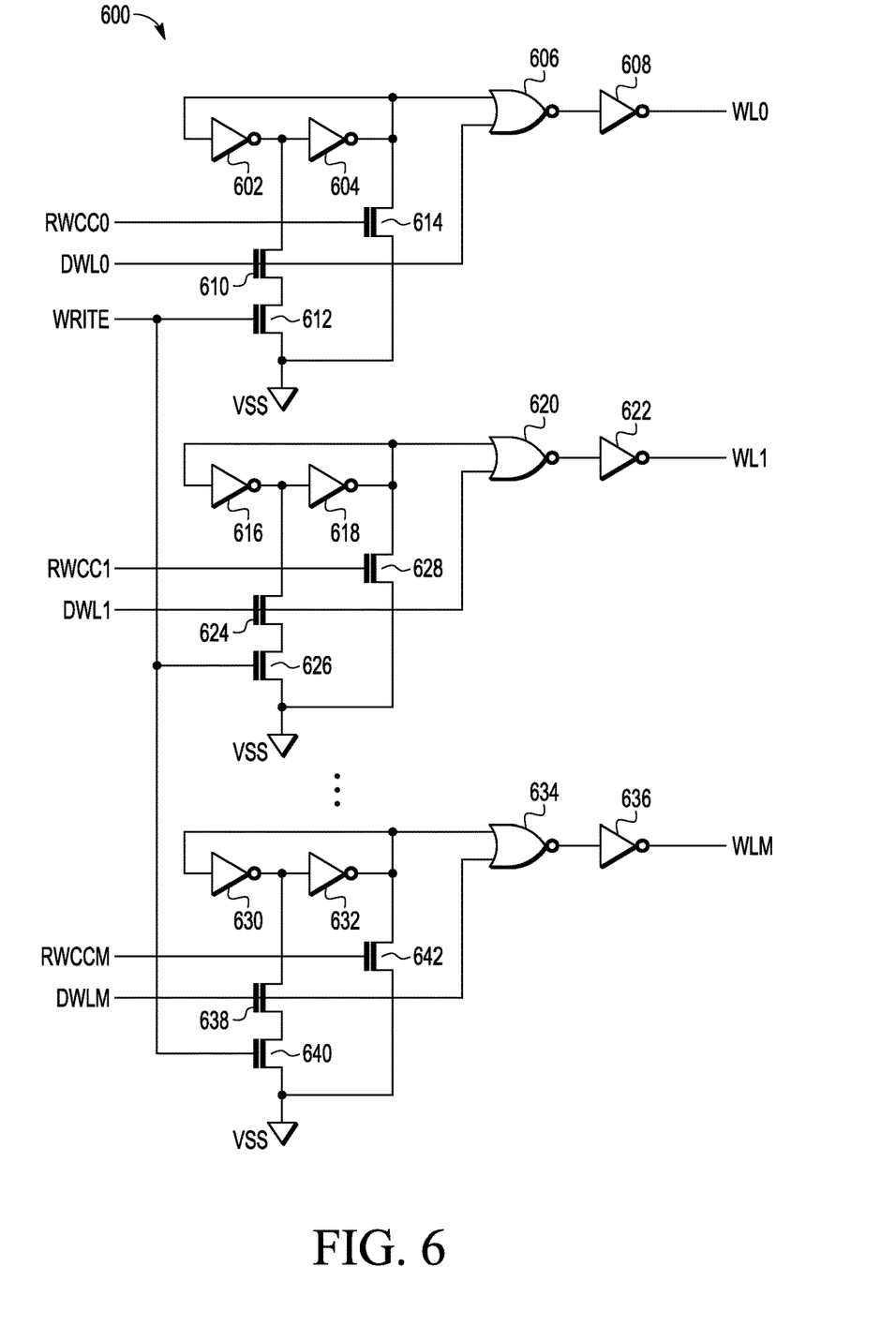
FIG. 6 illustrates, in simplified schematic diagram form, exemplary word line circuitry in accordance with an embodiment of the present invention.

FIG. 6 illustrates, in simplified schematic diagram form, exemplary word line driver circuitry 600 in accordance with an embodiment of the present invention. In this embodiment, word line driver circuit 600 is included in row circuit 204. Word line driver circuitry 600 receives row write cycle complete signals RWCC0-RWCCM by way of signal lines labeled RWCC0-RWCCM, decoded row address signals DWL0-DWLM by way of signal lines labeled DWL0-DWLM, write control signal by way of signal line labeled WRITE, and provides word line driver signals WL0-WLM by way of signal lines labeled WL0-WLM. Word line driver circuitry 600 includes a plurality of word line drivers. Each word line driver circuit is coupled to receive a row write cycle complete signal (e.g., RWCC0), a decoded row address signal (e.g., DWL0), and the WRITE control signal. Each word line driver circuit is coupled to provide a word line signal (e.g., WL0). WRITE control signal may be based on the RW control signal received at row circuit 204 (FIG. 2).

For example, a first word line driver circuit includes a cross-coupled inverter-pair latch circuit (602, 604), pull-down N-channel transistors 610-614, NOR gate 606, and inverter 608. An output of inverter 602 is connected to an input of inverter 604 and a first current electrode of transistor 610. A second current electrode of transistor 610 is connected to a first current electrode of transistor 612, and a second current electrode of transistor 612 is connected to first power supply terminal VSS. An output of inverter 604 is connected to an input of inverter 602, a first input of NOR gate 606, and a first current electrode of transistor 614. A second current electrode of transistor 614 is connected to first power supply terminal VSS, and a control electrode of transistor 614 is connected to signal line RWCC0. A control electrode of transistor 610 is connected to signal line DWL0 and a second input of NOR gate 606. A control gate of transistor 612 is connected to signal line WRITE. An output of NOR gate 606 is connected to an input of inverter 608, and an output of inverter 608 is connected to word line WL0.

Similarly, a second word line driver circuit includes a cross-coupled inverter-pair latch circuit (616, 618), pull-down N-channel transistors 624-628, NOR gate 620, and inverter 622. An output of inverter 616 is connected to an input of inverter 618 and a first current electrode of transistor 624. A second current electrode of transistor 624 is connected to a first current electrode of transistor 626, and a second current electrode of transistor 626 is connected to first power supply terminal VSS. An output of inverter 618 is connected to an input of inverter 616, a first input of NOR gate 620, and a first current electrode of transistor 628. A second current electrode of transistor 628 is connected to first power supply terminal VSS, and a control electrode of transistor 628 is connected to signal line RWCC1. A control electrode of transistor 624 is connected to signal line DWL1 and a second input of NOR gate 620. A control gate of transistor 626 is connected to signal line WRITE. An output of NOR gate 620 is connected to an input of inverter 622, and an output of inverter 622 is connected to word line WL1.

Likewise, an $M^{th}$ word line driver circuit includes a cross-coupled inverter-pair latch circuit (630, 632), pull-down N-channel transistors 638-642, NOR gate 634, and inverter 636. An output of inverter 630 is connected to an input of inverter 632 and a first current electrode of transistor 638. A second current electrode of transistor 638 is connected to a first current electrode of transistor 640, and a second current electrode of transistor 640 is connected to first power supply terminal VSS. An output of inverter 632 is connected to an input of inverter 630, a first input of NOR gate 634, and a first current electrode of transistor 642. A second current electrode of transistor 642 is connected to first power supply terminal VSS, and a control electrode of transistor 642 is connected to signal line RWCCM. A control electrode of transistor 638 is connected to signal line DWLM and a second input of NOR gate 634. A control gate of transistor 640 is connected to signal line WRITE. An output of NOR gate 634 is connected to an input of inverter 636, and an output of inverter 636 is connected to word line WLM.

Figure 7:
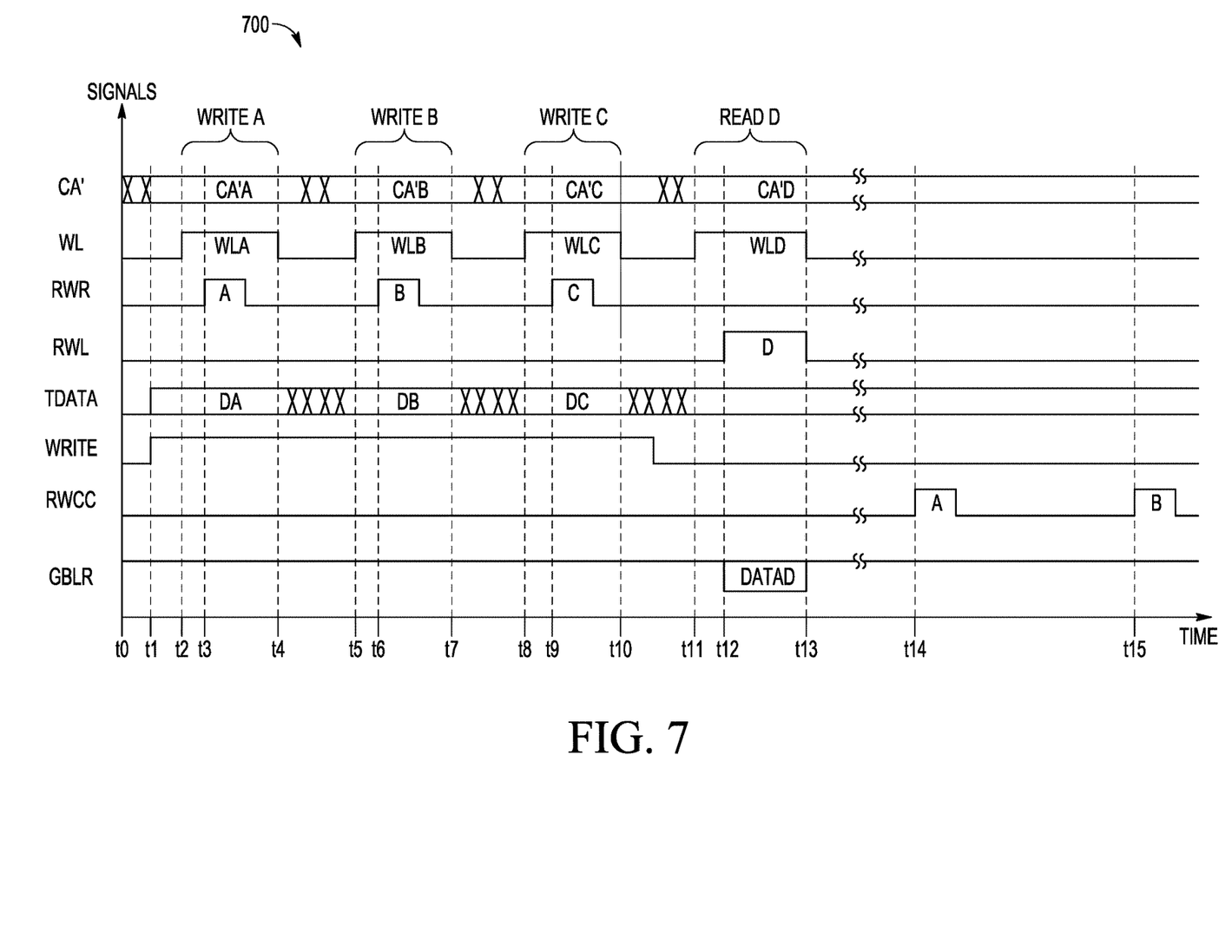
FIG. 7 illustrates, in timing diagram form, exemplary control signal timing for write and read operations in accordance with an embodiment of the present invention.

FIG. 7 illustrates, in timing diagram form, exemplary control signal timing for write and read operations in accordance with an embodiment of the present invention. Timing diagram 700 includes various signal waveforms versus time for write and read operations consistent with the exemplary tile read/write control circuitry 304, column access signal latch circuit 409, and word line driver circuitry 600 illustrated in FIGS. 4-6.

In this embodiment, timing waveforms such as WL, RWR, TDATA, and RWCC, may represent a simplified superimposed combination of individual waveforms. For example, the WL waveform includes four pulses, each pulse representing a separate word line signals associated with a unique tile as labeled. The pulse labeled WLA represents the word line signal received by tile A, the pulse labeled WLB represents the word line signal received by tile B, the pulse labeled WLC represents the word line signal received by tile C, and the pulse labeled WLD represents the word line signal received by tile D. Likewise, the RWR waveform includes 3 labeled pulses representing separate row write signals associated with tiles A, B, and C, respectively. And similarly, the RWCC waveform includes 2 labeled pulses representing separate row write cycle complete signals associated with tiles A and B, respectively. By way of example, following is signal timing for back-to-back writes and read operations.

At time t0, control signals WL, RWR, RWL, TDATA, WRITE, and RWCCP are de-asserted as a logic low level, and global bit line read signal GBLR is asserted as a logic high level. Column access signals CA' may be in unknown or invalid states as indicated by XX in the CA' waveform.

At time t1, column access signals CA' transition to a column access signal value CA'A in preparation for a first write operation to a first tile A. Column access signal CA'A selects a first column of bit cells to be accessed in first tile A. The TDATA signal transitions to a data value to be written to a first bit cell in first tile A as indicated by DA in TDATA waveform. Data is provided to first tile A by way of TDATA signal line. Write control signal WRITE is asserted as a logic high level in indicating that the imminent access will be a write access (WRITE A).

At time t2, a word line signal WLA provided to select a first row of first tile A is asserted as a logic high level. Because the write control signal WRITE is asserted and a first column and a first row are selected, a first write access cycle labeled WRITE A is started. The term write access cycle, as used herein, refers to a time period of a write access characterized as the period of time in which column access, word line, and write control signals are mutually active or asserted. For example, the write access cycle for first tile A may start with assertion of word line signal WLA as a logic high level and end with de-assertion of word line signal WLA as a logic low level. Write access cycles may also be referred to as write access periods.

At time t3, the first write operation to first tile A is initiated. Row write control signal RWR associated with first tile A is asserted to begin writing a selected bit cell in first tile A as determined by column access signal value CA'A and word line signal WLA. In this embodiment, the row write control signal RWR is formed as a self-timed pulse. The term write operation, as used herein, refers to the operation of writing or programming a bit cell. In this embodiment, write operations are initiated when the row write control signal RWR is asserted for an accessed tile and is completed when the row write cycle complete signal RWCC is asserted for the same tile. For example, the first write operation to first tile A is initiated when row write control signal RWR for first tile A is asserted and is completed when row write cycle complete signal RWCC for tile A is asserted. Because writing or programming a magnetoresistive bit cell is inherently slower than write accesses, the duration of a write operation my span an equivalent of several write access cycles.

At time t4, word line signal WLA is de-asserted ending the write access cycle of the selected bit cell in first tile A. Notwithstanding that the write access cycle in the first tile A ended, the write operation continues until the row write cycle complete signal RWCC for first tile A is asserted. In this embodiment, write operations may require the equivalent of several write access cycles to complete a state change in a magnetoresistive bit cell. Therefore, a counter, timer, or other timing mechanism may be used to determine when the row write cycle complete signal RWCC is asserted. Because the write access cycle for first tile A ends, a second write access cycle may begin with a write to a second tile B.

At time t5, column access signals CA' transitioned to a column access signal value CA'B in preparation for a second write operation to a second tile B. Column access signal CA'B selects a first column of bit cells to be accessed in second tile B. The TDATA signal transitioned to a data value to be written to a first bit cell in second tile B as indicated by DB in TDATA waveform. Data is provided to second tile B by way of TDATA signal line. Write control signal WRITE is asserted as a logic high level in the WRITE waveform. A word line signal WLB provided to select a first row of second tile B is asserted as a logic high level. Because the write control signal WRITE is asserted and a first column and a first row are selected, a second write access cycle labeled WRITE B is started.

At time t6, the second write operation to second tile B is initiated. Row write control signal RWR associated with second tile B is asserted to begin writing a selected bit cell in second tile B as determined by column access signal value CA'B and word line signal WLB.

At time t7, word line signal WLB is de-asserted ending the second write access cycle of the selected bit cell in second tile B. Notwithstanding that the second write access cycle in the second tile B ended, the second write operation continues until the row write cycle complete signal RWCC for second tile B is asserted. Because the second write access cycle for second tile B ends, a third write access cycle may begin with a write to a third tile C.

At time t8, column access signals CA' transitioned to a column access signal value CA'C in preparation for a third write operation to a third tile C. Column access signal CA'C selects a first column of bit cells to be accessed in third tile C. The TDATA signal transitioned to a data value to be written to a first bit cell in third tile C as indicated by DC in TDATA waveform. Data is provided to third tile C by way of TDATA signal line. Write control signal WRITE is asserted as a logic high level in the WRITE waveform. A word line signal WLC provided to select a first row of third tile C is asserted as a logic high level. Because the write control signal WRITE is asserted and a first column and a first row are selected, a third write access cycle labeled WRITE C is started.

At time t9, the third write operation to third tile C is initiated. Row write control signal RWR associated with third tile C is asserted to begin writing a selected bit cell in third tile C as determined by column access signal value CA'C and word line signal WLC.

At time t10, word line signal WLC is de-asserted ending the third write access cycle of the selected bit cell in third tile C. Notwithstanding that the third write access cycle in the third tile C ended, the third write operation continues until the row write cycle complete signal RWCC for third tile C is asserted. Here, write operations in tiles A, B, and C are active concurrently. In this embodiment, because the third write access cycle for third tile C ends, a subsequent read access cycle may begin with a read from a fourth tile D.

At time t11, column access signals CA' transitioned to a column access signal value CA'D in preparation for a read operation from a fourth tile D. Column access signal CA'D selects a first column of bit cells to be accessed in fourth tile D. Write control signal WRITE is de-asserted as a logic low level in the WRITE waveform. A word line signal WLD provided to select a first row of fourth tile D is asserted as a logic high level. Because the write control signal WRITE is de-asserted and a first column and a first row are selected, a read access cycle labeled READ D is started.

At time t12, the read operation from fourth tile D is initiated. Read word line control signal RWL associated with fourth tile D is asserted to begin reading a selected bit cell in fourth tile D as determined by column access signal value CA'D and word line signal WLD. In turn, the global bit line read signal GBLR transitions to a valid data value corresponding to a data value read from the selected bit cell in fourth tile D as indicated by DATAD in GBLR waveform. Here, write operations in tiles A, B, and C may still be active concurrently with the read operation. Because these read and write operations can be active concurrently in the architecture described herein, performance can approach that of a static random access memory (SRAM) for example, while maintaining a very small physical footprint.

At time t13, word line signal WLD is de-asserted ending the read access cycle of the selected bit cell in fourth tile D. Read word line control signal RWL associated with fourth tile D is de-asserted to end reading the selected bit cell in fourth tile D. In turn, GBLR signal returns to a pre-charge state as indicated by a logic high level in the GBLR waveform.

At time t14, row write cycle complete signal RWCC associated with first tile A is asserted to complete the first write operation and end writing the selected bit cell in first tile A as determined by column access signal value CA'A and word line signal WLA. In this embodiment, the row write cycle complete signal RWCC is formed as a self-timed pulse.

At time t15, row write cycle complete signal RWCC associated with second tile B is asserted to complete the second write operation and end writing the selected bit cell in second tile B as determined by column access signal value CA'B and word line signal WLB.

Generally, there is provided, a memory circuit including a plurality of memory tiles, each memory tile in the plurality of memory tiles including: a plurality of bit cells, and a control circuit coupled to the plurality of bit cells, the control circuit configured to provide latched data to the plurality of bit cells during write operations; a first write control line coupled to a first control circuit in a first memory tile in the plurality of memory tiles, the first write control line configured to receive a first write control signal to initiate a first write operation in the first memory tile; and a second write control line coupled to a second control circuit in a second memory tile in the plurality of memory tiles, the second write control line configured to receive a second write control signal to initiate a second write operation in the second memory tile, the second write operation initiated before the first write operation is completed. Each bit cell in the plurality of bit cells may include a select transistor coupled in series with a resistive non-volatile memory (NVM) element. The control circuit in each memory tile may be configured to further provide latched access signals to the plurality of bit cells, and wherein a control electrode of the select transistors of bit cells is coupled to receive the latched access signals. The memory circuit may further include a first global bit line coupled to memory tiles in a first column of the plurality of memory tiles, the first global bit line configured to provide a first read data signal during a first read operation. Each memory tile in the plurality of memory tiles may further include a first local bit line coupled to a first row of bit cells in the first plurality of bit cells, the first local bit line operatively coupled to a second local bit line by way of an access transistor coupled to a first word line. Each control circuit may be configured to operatively couple the second local bit line with a global bit line during a read operation. Each memory tile in the plurality of memory tiles may further include a third local bit line coupled to the first row of bit cells in the plurality of bit cells, the third local bit line configured to receive a ground voltage during a read operation. The memory circuit may further include a first write data line coupled to memory tiles in the first column of the plurality of memory tiles, the first write data line configured to provide a first write data signal during the first write operation. Each control circuit may include a data latch configured to provide the latched data, the latched data used to write a data value to a bit cell. The data latch may be further configured to latch a data value received by the first write data signal.

In another embodiment, there is provided, a memory circuit including a plurality of memory tiles arranged in rows and columns, each memory tile in the plurality of memory tiles including: a plurality of resistive NVM bit cells, and a control circuit coupled to the plurality of resistive NVM bit cells, the control circuit configured to provide latched data and latched access signals to the bit cells; and a first global bit line coupled to memory tiles in a first column of the plurality of memory tiles, the first global bit line configured to provide a first read data signal during a first read operation. Each bit cell in the plurality of resistive NVM bit cells may include a select transistor coupled in series with a resistive NVM element. The select transistor of each bit cell in the plurality of resistive NVM bit cells may be coupled to one of the latched access signals. Each memory tile in the plurality of memory tiles may further include a first local bit line, the first local bit line coupled to a first row of bit cells in the plurality of resistive NVM bit cells. Each memory tile in the plurality of memory tiles may further include a first transistor having a first current electrode coupled to the first local bit line and a second current electrode coupled to the control circuit. The memory circuit may further include a first word line coupled to memory tiles in a first row of the plurality of memory tiles. The first word line may be coupled to a control electrode of first transistors in memory tiles in the first row of the plurality of memory tiles.

In yet another embodiment, there is provided, a method including providing a plurality of memory tiles, each memory tile including a plurality of resistive non-volatile memory (NVM) bit cells and a control circuit coupled to the plurality of resistive NVM bit cells, the control circuit providing latched data to the plurality of resistive NVM bit cells during write operations; initiating a first write operation in a first memory tile, the first write operation using the latched data stored in the first memory tile to write to a resistive NVM bit cell in the first memory tile; and initiating a second write operation in a second memory tile before the first write operation is completed, the second write operation using latched data stored in the second memory tile to write to a resistive NVM bit cell in the second memory tile. The method may further include receiving a first write control signal at the first memory tile, the first write control signal asserted to initiate the first write operation; and receiving a second write control signal at the first memory tile, the second write control signal asserted to complete the first write operation. Each bit cell in the plurality of bit cells may include a select transistor coupled in series with a magnetoresistive element.

By now it should be appreciated that there has been provided, an integrated circuit memory that includes magnetoresistive bit cells arranged in memory tiles. Each memory tile includes read and write control circuitry allowing concurrent write operations in different memory tiles. Because write operations can occur in a first memory tile, and a second write operation can occur in a second memory tile before the first write is completed, overall write times can be compressed when concurrently writing to several memory tiles. Thus, overall read/write performance can rival as an alternative to static random access memory (SRAM) or dynamic random access memory (DRAM).

As used herein, the term "bus" is used to refer to a plurality of signals or conductors which may be used to transfer one or more various types of information, such as data, accesses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name, an asterix (*) following the name, or the letter "B" at the end of the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A memory circuit, comprising:
   a plurality of memory tiles, each memory tile in the plurality of memory tiles comprising:
      a plurality of bit cells, and
      a control circuit coupled to the plurality of bit cells, the control circuit configured to provide latched data to the plurality of bit cells during write operations;
   a first write control line coupled to a first control circuit in a first memory tile in the plurality of memory tiles, the first write control line configured to receive a first write control signal to initiate a first write operation in the first memory tile; and
   a second write control line coupled to a second control circuit in a second memory tile in the plurality of memory tiles, the second write control line configured to receive a second write control signal to initiate a second write operation in the second memory tile and to complete the first write operation, the second write operation initiated after the first write operation is initiated and before the first write operation is completed.

2. The memory circuit of claim 1, wherein each bit cell in the plurality of bit cells comprises a select transistor coupled in series with a resistive non-volatile memory (NVM) element.

3. The memory circuit of claim 2, wherein the control circuit in each memory tile is configured to further latch access signals and provide the latched access signals to the plurality of bit cells, and wherein a control electrode of the select transistors of bit cells is coupled to receive the latched access signals.

4. The memory circuit of claim 1, further comprising a first global bit line coupled to memory tiles in a first column of the plurality of memory tiles, the first global bit line configured to provide a first read data signal during a first read operation.

5. The memory circuit of claim 1, wherein each memory tile in the plurality of memory tiles further comprises a first local bit line coupled to a first row of bit cells in the first plurality of bit cells, the first local bit line operatively coupled to a second local bit line by way of an access transistor coupled to a first word line.

6. The memory circuit of claim 5, wherein each control circuit is configured to operatively couple the second local bit line with a global bit line during a read operation.

7. The memory circuit of claim 5, wherein each memory tile in the plurality of memory tiles further comprises a third local bit line coupled to the first row of bit cells in the plurality of bit cells, the third local bit line configured to receive a ground voltage during a read operation.

8. The memory circuit of claim 5, further comprising a first write data line coupled to memory tiles in the first column of the plurality of memory tiles, the first write data line configured to provide a first write data signal during the first write operation.

9. The memory circuit of claim 8, wherein each control circuit comprises a data latch configured to provide the latched data, the latched data used to write a data value to a bit cell.

10. The memory circuit of claim 1, wherein each control circuit further comprises a tristate control latch configured to latch a row write control signal.

11. A memory circuit, comprising:
a plurality of memory tiles arranged in rows and columns, each memory tile in the plurality of memory tiles comprising:
  a plurality of resistive NVM bit cells, and
  a control circuit coupled to the plurality of resistive NVM bit cells, the control circuit configured to provide latched data and latched access signals to the bit cells;
a first write control line configured to receive a first write control signal to initiate a first write operation in a first memory tile of the plurality of memory tiles;
a second write control line configured to receive a second write control signal to initiate a second write operation in a second memory tile of the plurality of memory tiles and to complete the first write operation, the second write operation initiated after the first write operation is initiated and before the first write operation is completed; and
a first global bit line coupled to memory tiles in a first column of the plurality of memory tiles, the first global bit line configured to provide a first read data signal during a first read operation,
wherein the plurality of memory tiles and the plurality of resistive NVM bit cells are arranged in an orthogonal planar array.

12. The memory circuit of claim 11, wherein each bit cell in the plurality of resistive NVM bit cells comprises a select transistor coupled in series with a resistive NVM element.

13. The memory circuit of claim 12, wherein the select transistor of each bit cell in the plurality of resistive NVM bit cells is coupled to one of the latched access signals.

14. The memory circuit of claim 11, wherein each memory tile in the plurality of memory tiles further comprises a first local bit line, the first local bit line coupled to a first row of bit cells in the plurality of resistive NVM bit cells.

15. The memory circuit of claim 14, wherein each memory tile in the plurality of memory tiles further comprises a first transistor having a first current electrode coupled to the first local bit line and a second current electrode coupled to the control circuit.

16. The memory circuit of claim 15, further comprising a first word line coupled to memory tiles in a first row of the plurality of memory tiles.

17. The memory circuit of claim 16, wherein the first word line is coupled to a control electrode of first transistors in memory tiles in the first row of the plurality of memory tiles.

18. A method comprising:
providing a plurality of memory tiles, each memory tile comprising a plurality of resistive non-volatile memory (NVM) bit cells and a control circuit coupled to the plurality of resistive NVM bit cells, the control circuit providing latched data and providing latched access signals to the plurality of resistive NVM bit cells during write operations;
initiating a first write operation in a first memory tile, the first write operation using the latched data stored in the first memory tile to write to a resistive NVM bit cell in the first memory tile;
initiating a second write operation in a second memory tile before the first write operation is completed, the second write operation using latched data stored in the second memory tile to write to a resistive NVM bit cell in the second memory tile;
receiving a first write control signal at the first memory tile, the first write control signal asserted to initiate the first write operation; and
receiving a second write control signal at the first memory tile, the second write control signal asserted to complete the first write operation.

19. The method of claim 18, wherein each bit cell in the plurality of bit cells comprises a select transistor coupled in series with a magnetoresistive element.

20. The method of claim 18, further comprising providing a first read data signal during a first read operation by way of a first global bit line coupled to memory tiles in a first column of the plurality of memory tiles.

* * * * *